US 7,029,983 B2

(12) United States Patent
Kim

(10) Patent No.: US 7,029,983 B2
(45) Date of Patent: Apr. 18, 2006

(54) METHODS OF FORMING MIM TYPE CAPACITORS BY FORMING UPPER AND LOWER ELECTRODE LAYERS IN A RECESS THAT EXPOSES A SOURCE/DRAIN REGION OF A TRANSISTOR AND MIM CAPACITORS SO FORMED

(75) Inventor: Hong-Ki Kim, Kyunggi-do (KR)

(73) Assignee: Samsung Electronics Co., Ltd., (KR)

( * ) Notice: Subject to any disclaimer, the term of this patent is extended or adjusted under 35 U.S.C. 154(b) by 167 days.

(21) Appl. No.: 10/318,817

(22) Filed: Dec. 13, 2002

(65) Prior Publication Data
US 2003/0129805 A1 Jul. 10, 2003

(30) Foreign Application Priority Data
Jan. 10, 2002 (KR) .................... 2002-1469

(51) Int. Cl.
*H01L 21/20* (2006.01)
(52) U.S. Cl. ............... 438/393; 438/394; 438/396; 257/306; 257/310
(58) Field of Classification Search ........ 438/240, 438/250, 251, 253, 393, 394, 396; 257/306, 257/310
See application file for complete search history.

(56) References Cited

U.S. PATENT DOCUMENTS 5,817,555 A * 10/1998 Cho ..................... 438/253
5,828,092 A * 10/1998 Tempel .................. 257/295
5,972,791 A * 10/1999 Schuele ................. 438/653
6,235,580 B1 * 5/2001 Lee et al. ............... 438/253
6,277,687 B1 * 8/2001 Agarwal ................ 438/255
6,475,855 B1 * 11/2002 Fishburn ................ 438/239
6,518,117 B1 * 2/2003 Ping et al. .............. 438/239

FOREIGN PATENT DOCUMENTS

GB          2350929         * 12/2000
JP         2000-332221        11/2000

OTHER PUBLICATIONS

Translation of Korean Office Action for corresponding Korean Application No. 10-2002-0001469 dated Dec. 26, 2003.

* cited by examiner

*Primary Examiner*—Zandra V. Smith
*Assistant Examiner*—Christy Novacek
(74) *Attorney, Agent, or Firm*—Myers Bigel Sibley & Sajovec

(57) ABSTRACT

A MIM capacitor can be formed by forming an insulating layer on a source/drain region of a transistor. A first pattern is formed on the insulating layer. A recess is formed in the insulating layer using the first pattern, wherein the recess exposes the source/drain region. A first electrode layer is formed in the recess on the source/drain region. A dielectric layer and a second electrode layer are formed on the first electrode layer in the recess. A second pattern is formed on the second electrode layer. The MIM capacitor is formed by removing a portion of the second electrode and the dielectric layer using the second pattern.

22 Claims, 7 Drawing Sheets

METHODS OF FORMING MIM TYPE CAPACITORS BY FORMING UPPER AND LOWER ELECTRODE LAYERS IN A RECESS THAT EXPOSES A SOURCE/DRAIN REGION OF A TRANSISTOR AND MIM CAPACITORS SO FORMED

CLAIM FOR PRIORITY AND REFERENCE TO RELATED APPLICATION

This application claims priority to Korean Patent Application No. 2002-01469, filed on Jan. 10, 2002, the disclosure of which is hereby incorporated herein by reference.

FIELD OF THE INVENTION

The present invention relates generally to semiconductor devices, and more particularly to, methods of forming Metal-Insulator-Metal (MIM) capacitors and MIM capacitors so formed.

BACKGROUND

As portable electronic devices, like cellular phones, camcorders, and game machines, have become popular, the need for embedded memory logic (EML) semiconductor devices has increased. EML semiconductor devices generally employ DRAMs as memories for high-speed operations as well as other types of circuits for other purposes.

FIG. 1 is a cross-sectional view for illustrating a method of fabricating a capacitor associated with a transistor of a typical DRAM semiconductor device. A first interlayer dielectric layer (ILD) can be formed on the semiconductor device 10. Thereafter, the first ILD can be patterned to form a first interlayer dielectric layer pattern (ILD pattern) 20 with a first opening 25 exposing the semiconductor device 10. A conductive contact plug 30 can be formed in the first opening 25 to connect to the semiconductor substrate 10.

A second ILD can be formed on an entire surface of the semiconductor substrate including the contact plug 30. The second ILD can be patterned to form a second ILD pattern 40 with a second opening 45 exposing a top surface of the contact plug 30.

A lower electrode layer and a sacrificial layer (not shown) can be conformally deposited on an entire surface of the semiconductor substrate including the second ILD pattern 40. The sacrificial layer and the lower electrode layer can be etched to expose a top surface of the second ILD pattern 40, thereby forming a lower electrode 50 and a sacrificial layer pattern, which sequentially fill the second opening 45. The sacrificial layer pattern can be removed to expose an inner wall of the lower electrode 50.

A dielectric layer 60 and an upper electrode layer can be sequentially formed on an entire surface of the semiconductor substrate including the exposed lower electrode 50. The upper electrode layer can be patterned to expose a top surface of the dielectric layer 60, thereby forming an upper electrode 70, which can fill the second opening 45 and extend outside the second opening 45 onto the top surface of the dielectric layer 60.

Fabrication of a DRAM capacitor according to the foregoing conventional method includes performing photolithographic and etching processes three times: 1) form the first opening 25; 2) forming the second opening 45; and 3) forming the upper electrode 70.

A DRAM cell capacitor can typically include a lower electrode having a height $h_1$ of about 10000 Å, or more, to increase the integration level of the devices and provide sufficient capacitance. However, because of the height $h_1$ of the lower electrode 50, some processes of fabricating DRAMs may not be compatible with those of logic circuits. These incompatibilities may make it difficult to simplify the fabrication of EML semiconductor devices, which may not reduce fabrication costs.

SUMMARY

Embodiments according to the present invention can provide MIM capacitors in semiconductor devices. Pursuant to these embodiments, a MIM capacitor can be formed by forming an insulating layer on a source/drain region of a transistor. A first pattern can be formed on the insulating layer. A recess can be formed in the insulating layer using the first pattern, wherein the recess exposes the source/drain region. A first electrode layer can be formed in the recess that exposes the source/drain region. A dielectric layer and a second electrode layer are formed on the first electrode layer in the recess. A second pattern is formed on the second electrode layer. The MIM capacitor can be formed by removing a portion of the second electrode layer and the dielectric layer using the second pattern.

In some embodiments according to the present invention, forming the dielectric layer and the second electrode layer can include forming the dielectric layer and the second electrode layer on the first electrode layer in the recess. In some embodiments according to the present invention, forming a first electrode layer can include forming a first layer of the first electrode layer directly on the source/drain region and forming a second layer of the first electrode layer on the first layer.

In some embodiments according to the present invention, the first layer can be at least one of titanium and cobalt. In some embodiments according to the present invention, the second layer can be titanium nitride.

In some embodiments according to the present invention, forming the first electrode layer can include forming a first layer of the first electrode layer on a side wall of the recess and outside the recess on a surface of the insulating layer. A second layer of the first electrode layer can be formed on the first layer. The first layer can be etched from the surface of the insulating layer and from the side wall into the recess beyond an opening of the recess to provide an exposed portion of the side wall.

In further embodiments according to the present invention, etching the second layer from the side wall into the recess beyond the opening can be avoided to form a gap between the side wall and the second layer. In still further embodiments according to the present invention, the insulating layer can be etched to reduce a height thereof and etching of the second layer can be avoided so that the second layer protrudes from the recess beyond the reduced height surface of the insulating layer.

In some embodiments according to the present invention, avoiding etching the second layer includes etching the first layer using an isotropic etch process with an etchant that having an etch selectivity with respect to the second layer.

In some embodiments according to the present invention, a MIM capacitor according to the present invention can be formed by forming an insulating layer having a recess therein that exposes an underlying source/drain region of a transistor. A first lower electrode layer of a MIM capacitor can be formed in the recess directly on the source/drain region. A second lower electrode layer of the MIM capacitor can be formed in the recess on the first lower electrode layer and a dielectric layer and an upper electrode layer of the MIM capacitor can be formed on the second lower electrode layer in the recess to provide the MIM capacitor.

In further embodiments according to the present invention, a MIM capacitor of a semiconductor device can be formed using two photolithographic and etching processes. Thus, the present invention can provide a reduction in the number of similar type steps used in conventional methods, which may employ three photolithographic and etching processes. According to the present invention, a capacitor dielectric layer can be composed of a high k-dielectric layer so as to allow an adequate capacitance capacitor and lower the height of the MIM capacitor. For this, an MIM capacitor can be disposed in the ILD pattern by the side of a gate pattern. As a result, embedded memory logic (EML) semiconductor devices with logic circuits and DRAMs can been effectively fabricated.

In accordance with the feature of the present invention, provided is a capacitor of a semiconductor device, which can be disposed in an interlayer dielectric layer (ILD) between gate patterns, and in which a material layer with a high dielectric constant can be used as a capacitor dielectric layer. The capacitor comprises an interlayer dielectric layer pattern (ILD pattern), which can be disposed on a semiconductor substrate and has an opening exposing a top surface of the semiconductor substrate, and a first lower electrode covering a sidewall and a bottom of the opening. A second lower conductive layer pattern can be disposed on an inner wall of the first lower electrode. A dielectric layer pattern and an upper electrode are sequentially stacked on exposed surfaces of the first lower electrode and the second lower conductive layer pattern.

At this time, it is preferable that the first lower electrode has a top surface lower than that of the ILD pattern, and the second lower conductive layer pattern has a top surface higher than that of the first lower electrode. Also, a heavily doped region is additionally disposed in the semiconductor substrate under the opening.

The first lower electrode can be preferably composed of one selected from the group consisting of titanium, cobalt, titanium silicide, and cobalt silicide. The second lower conductive layer pattern can be preferably composed of at least one selected from the group consisting of titanium nitride, tungsten, and ruthenium. In addition, the dielectric layer pattern can be preferably at least one selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

In accordance with another feature of the present invention, provided is a method of fabricating a capacitor of a semiconductor device that comprises forming a lower electrode of a capacitor in an ILD covering gate patterns such that the lower electrode of the capacitor can be in directly contact with an semiconductor substrate. The method comprises forming the ILD pattern on the semiconductor substrate to have an opening exposing the semiconductor substrate, then sequentially forming a first lower conductive layer, a second lower conductive layer, and a sacrificial layer on the resultant structure. The sacrificial layer through the first lower conductive layer pattern are successively etched until a top surface of the ILD pattern is exposed, thereby forming a first lower conductive layer pattern, a second lower conductive layer pattern, and a sacrificial layer pattern, which sequentially fill the opening. The sacrificial layer pattern can then removed. The first lower conductive layer pattern can be etched to form a first lower electrode having a top surface lower than that of the ILD pattern. Thereafter, a dielectric layer and an upper electrode layer are sequentially formed on an entire surface of the semiconductor substrate including the first lower electrode.

Preferably, the first lower conductive layer may be composed of either titanium or cobalt, and the second lower conductive layer may be composed of one selected from the group consisting of titanium nitride, tungsten, and ruthenium. In addition, the dielectric layer can be preferably at least one selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a haftium oxide layer ($HfO_2$).

It can be preferable that the sacrificial layer and the first lower conductive layer are successively etched using chemical mechanical polishing (CMP). The sacrificial layer pattern can be preferably removed using an isotropic etch process and an etch recipe having an etch selectivity with respect to the ILD pattern, the first and second lower conductive layer patterns.

Forming the first lower electrode employs an etch recipe having an etch selectivity with respect to the second lower electrode pattern. In this case, an etchant can be preferably a mixed solution of $CH_3COOH$, $CH_3COONH_4$, $NH_4F$, and a deionized water.

Preferably, removing the sacrificial layer pattern can be followed by recessing the first lower conductive layer pattern. Nevertheless, it is also possible that, after recessing the first lower conductive layer pattern, the sacrificial layer pattern is removed.

Also, before forming the ILD pattern, a heavily doped region can be preferably formed in the semiconductor substrate under the opening.

Figure 1:
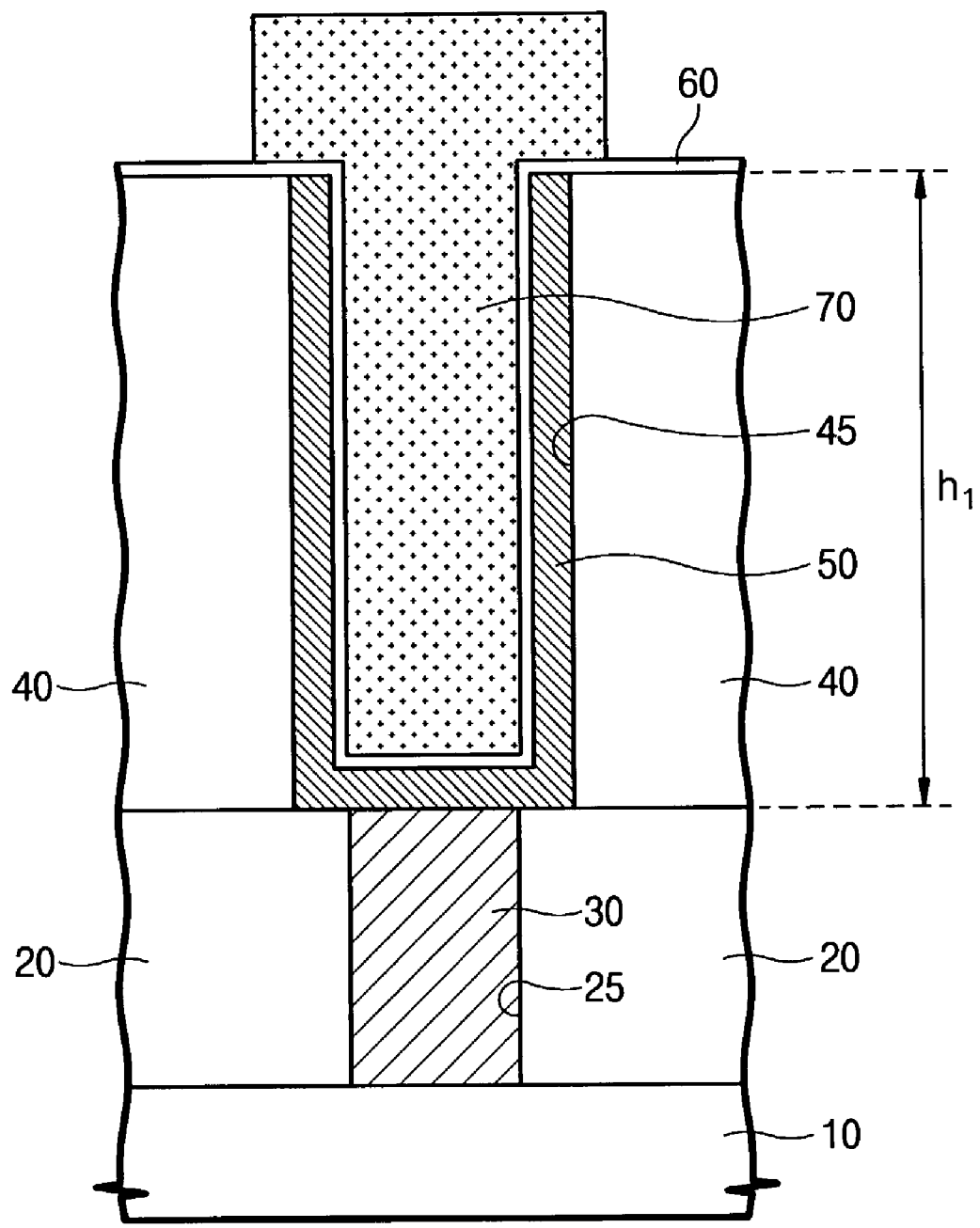
FIG. 1 is a cross-sectional view for illustrating a method of fabricating a capacitor of a conventional DRAM semiconductor device.

DESCRIPTION OF EMBODIMENTS
ACCORDING TO THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions may be exaggerated for clarity. It will be understood that when a layer is referred to as being "on" another layer or element, it can be directly on the other layer, or intervening layers may also be present. Alternatively, when an element is described as being "directly on" another element, no intervening elements are present between the elements. Like numbers refer to like elements throughout.

It will be understood that although this disclosure describes MIM type capacitors used with DRAMs, the MIM type capacitors according to the present invention may be used with other types of circuits, such as logic circuits, which are not described herein in detail for the sake of clarity. For example, a dielectric layer of the MIM capacitor for logic circuits may be thicker than that of a MIM capacitor for DRAMs. Since such differences would be apparent to those skilled in the art upon reading this disclosure further description of these features will not be provided.

Figure 2:
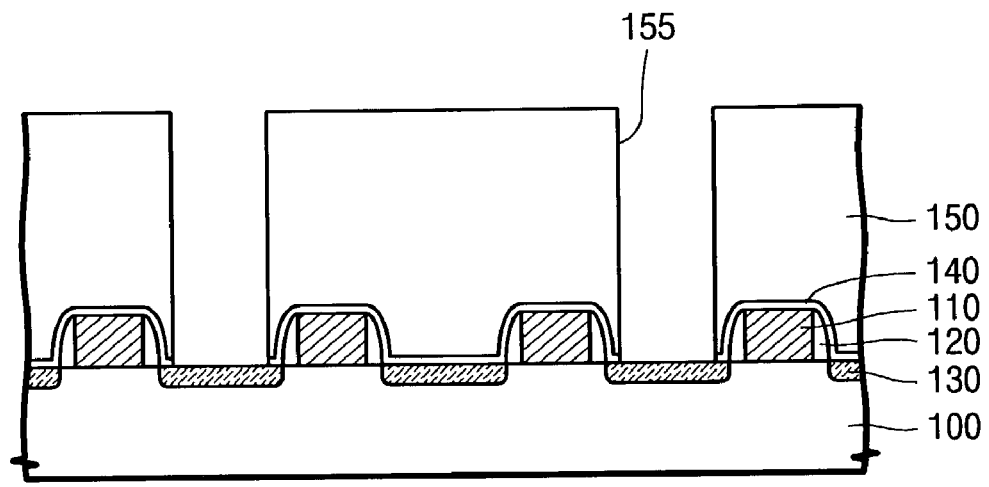
FIGS. 2 through 7 are cross-sectional views that illustrate methods of fabricating MIM capacitors in a semiconductor device according to embodiments of the present invention and MIM capacitors so formed.

FIGS. 2 through 7 are cross-sectional views that illustrate methods of fabricating MIM capacitors in a semiconductor device according to embodiments of the present invention. Referring to FIG. 2, a device isolation layer (not shown) is formed at a predetermined region of a semiconductor substrate 100 to define an active region. A gate pattern 110 is formed on the semiconductor substrate including the device isolation layer, and a spacer 120 is formed on a side wall of the gate pattern 110. An ion implantation process is implemented using the spacer 120 as a mask, thereby forming a heavily doped region 130 (i.e., a source/drain region) in the active region. An etch stop layer and an ILD are formed on an entire surface of the semiconductor substrate including the heavily doped region 130. The ILD and the etch stop layer are successively patterned to form an ILD pattern 150 and an etch stop layer pattern 140. The ILD pattern 150 has a recess 155 therein that exposes a surface of the heavily doped region 130.

In some embodiments according to the present invention, the ILD pattern 150 is a silicon oxide layer. The etch stop layer pattern 140 is a material having an etch selectivity with respect to the ILD pattern 150. In some embodiments according to the present invention, the etch stop layer pattern 140 is a silicon nitride layer or a silicon oxynitride layer.

In some embodiments according to the present invention, the etch process for forming the recess 155 includes etching the ILD using an etchant having an etch selectivity with respect to the etch stop layer, then etching the etch stop layer using an etchant having an etch selectivity with respect to the semiconductor substrate 100.

Figure 3:
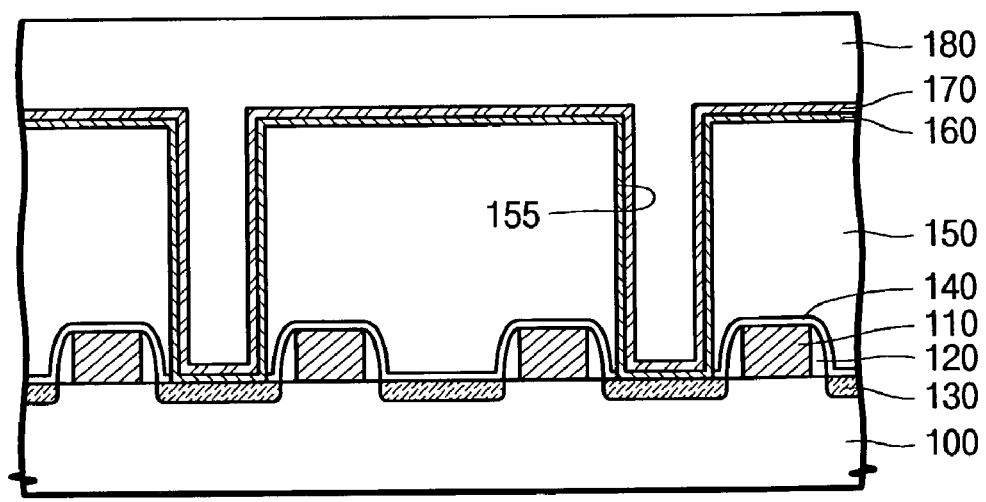

Referring to FIG. 3, a first lower conductive layer 160 (or first lower electrode layer), a second lower conductive layer 170 (or second lower electrode layer), and a sacrificial layer 180 are sequentially formed on an entire surface of the semiconductor substrate including in the recess 155.

In some embodiments according to the present invention, forming the MIM capacitor includes forming the lower electrode directly on the heavily doped region 130. For example, the first lower conductive layer 160 described above can be formed in the recess 155 to be directly on the heavily doped region 130. A width of the recess 155 is preferably as narrow as possible. This can allow an aspect ratio of the recess 155 to be increased.

The first and second lower conductive layers 160 and 170 should be selected to provide reliable step coverage characteristics, and the sacrificial layer 180 should provide a reliable gap-fill characteristic. In some embodiments according to the present invention, the second lower conductive layer 170 is titanium nitride.

If the second lower conductive layer 170, composed of titanium nitride, were to be formed directly on the heavily doped region 130, a contact resistance may be excessively increased. The first lower conductive layer 160 being formed between the second lower conductive layer 170 and the heavily doped region 130 can, however, reduce this increase in resistance. For example, in some embodiments according to the present invention, the first lower conductive layer 160 is formed by stacking a material layer of either titanium or cobalt, and performing a rapid thermal process on the resultant structure. As a result of the rapid thermal process, the first lower conductive layer 160 can react with the silicon in the heavily doped region 130, thereby forming a silicide layer which can provide an ohmic contact to the heavily doped region 130. In some embodiments according to the present invention, the first and second lower conductive layers 160 and 170 are formed using chemical vapor deposition (CVD) to promote reliable step coverage.

The sacrificial layer 180 is formed of a material having a reliable gap-fill characteristic, as described above, to improve a subsequent planarization etching process. In some embodiments according to the present invention, the sacrificial layer 180 is removed after the planarizing process. The removal of the sacrificial layer can cause a surface height of the ILD pattern 150 to be recessed or reduced. Accordingly, the sacrificial layer 180 is composed of a material having a reliable gap-fill characteristic as well as an etch selectivity with respect to the ILD pattern 150. The sacrificial layer 180 is preferably composed of at least one selected from SOG materials and photoresist materials.

Figure 4:
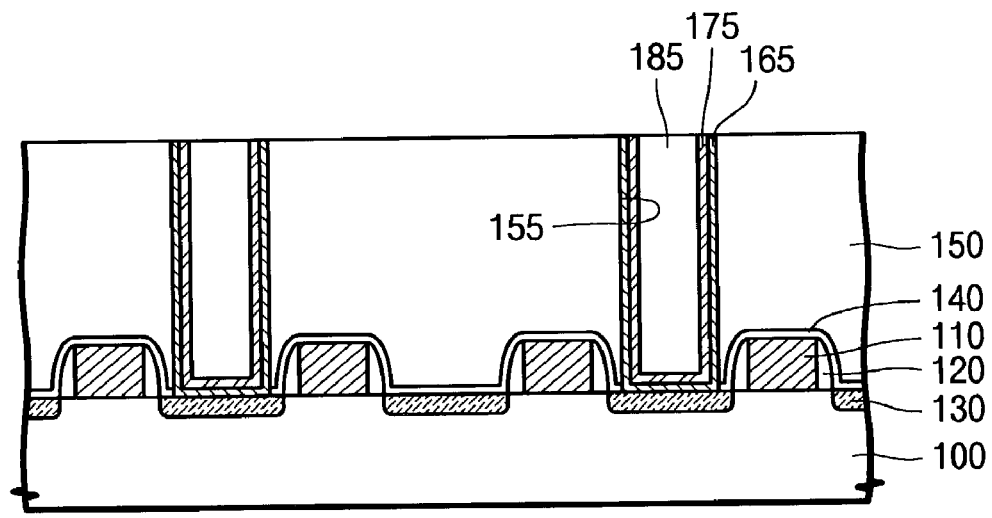

Referring to FIG. 4, a process for separating a lower electrode is performed. That is, the sacrificial layer 180, the second lower conductive layer 170, and the first lower conductive layer 160 are successively etched to expose a top surface of the ILD pattern 150. Thus, the first and second lower conductive layers 160 and 170 are etched to form first and second lower conductive layer patterns 165 and 175 on an inner wall (or side wall) of the recess 155. The sacrificial layer 180 is also etched during the process for separating the lower electrode to form a sacrificial layer pattern 185 filling an inside of the second lower conductive layer pattern 175.

In some embodiments according to the present invention, the etchback process, which is performed during the process for separating the lower electrode, employs chemical mechanical polishing (CMP). As a result, planarized top surfaces of the first and second lower conductive layer patterns 165 and 175, the sacrificial layer pattern 185, and the ILD pattern 150 are exposed.

Figure 5:
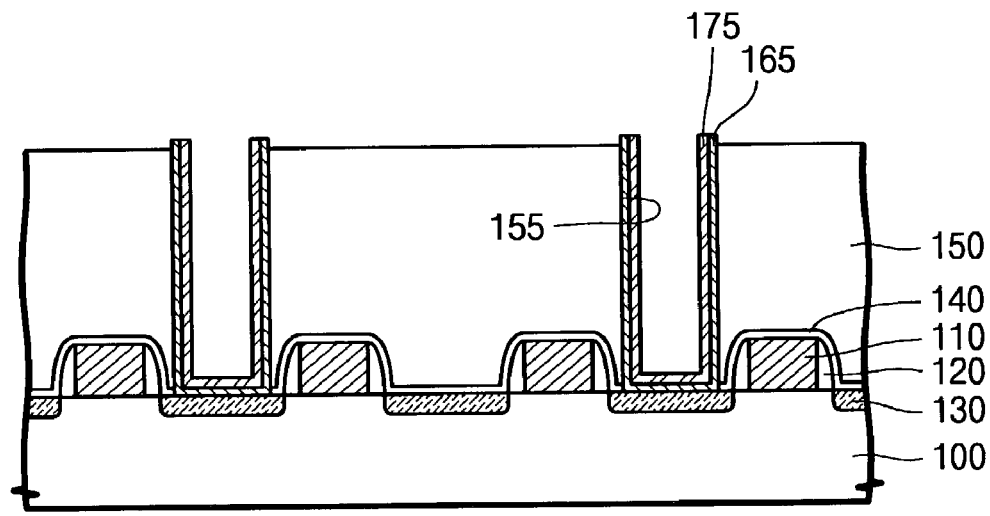

Referring to FIG. 5, the exposed sacrificial layer pattern 185 is removed to expose a side wall of the second lower conductive layer pattern 175. The sacrificial layer pattern 185 is removed using an etchant having an etch selectivity with respect to the first and second lower conductive layer patterns 165 and 175 and the ILD pattern 150. In some embodiments according to the present invention, the removal of the sacrificial layer pattern 185 employs an isotropic etch process and preferably a wet etch process.

The sacrificial layer pattern 185 has an etch selectivity with respect to the first and second lower conductive layer patterns 165 and 175, which are composed of metal materials. The sacrificial layer pattern 185 may not have an etch selectivity with respect to the ILD pattern 150, which is composed of an oxide layer. Thus, the height of the ILD pattern 150 is recessed (or reduced) during the removal of the sacrificial layer pattern 185 to have a lower surface than the first and second lower conductive layer patterns 165 and 175 as illustrated in FIG. 5.

Figure 6:
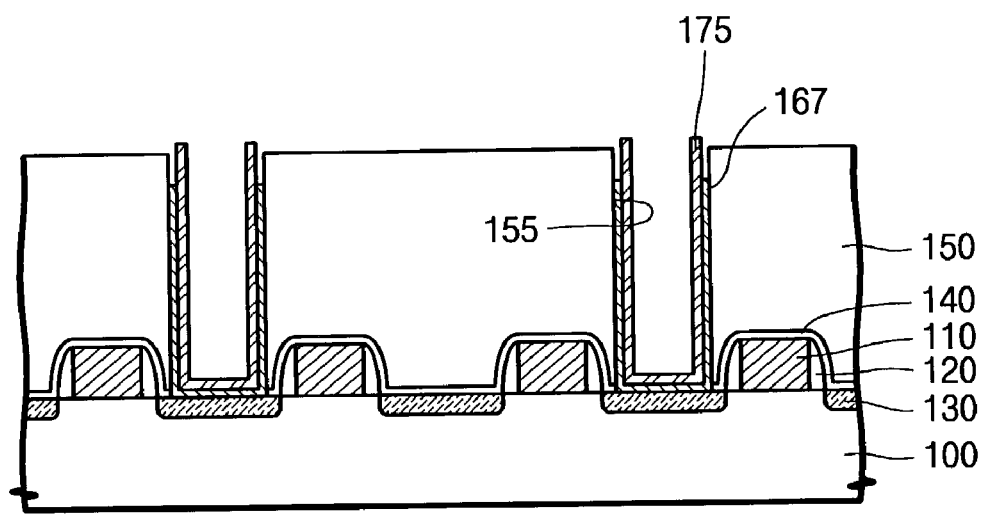

Referring to FIG. 6, in some embodiments according to the present invention, the first lower conductive layer pattern 165 is etched into the recess 155 beyond an opening thereof to expose a portion of the side wall of the recess 155 to form a first lower electrode 167. As sown in FIG. 6, the first lower electrode 167 has a top surface that is lower than those of the ILD pattern 150 and the second lower conductive layer pattern 175 which defines a gap between the exposed portion of the side wall and the second lower conductive layer pattern 175. In other embodiments according to the present invention, the etching of the first lower conductive layer pattern 165 into the recess 155 beyond the opening thereof may be carried out before removing the sacrificial layer pattern 185 from the recess 155.

In some embodiments according to the present invention, the etching process for forming the first lower electrode 167 employs an isotropic etch process as well as an etchant having an etch selectivity with respect to the ILD pattern 150 and the second lower conductive layer pattern 175. In some embodiments according to the present invention, the etching process for forming the first lower electrode 167 is preferably performed at 35° C. using a mixed solution of $CH_3COOH$, $CH_3COONH_4$, $NH_4F$, and a deionized water as an etchant.

As discussed above, the gap, where the first lower conductive layer pattern 167 is etched into the recess, is formed between the ILD pattern 150 and the second lower conductive layer pattern 175. The first lower electrode 167 is separated from a top surface of the ILD pattern 150 by a depth of the gap region.

Figure 7:
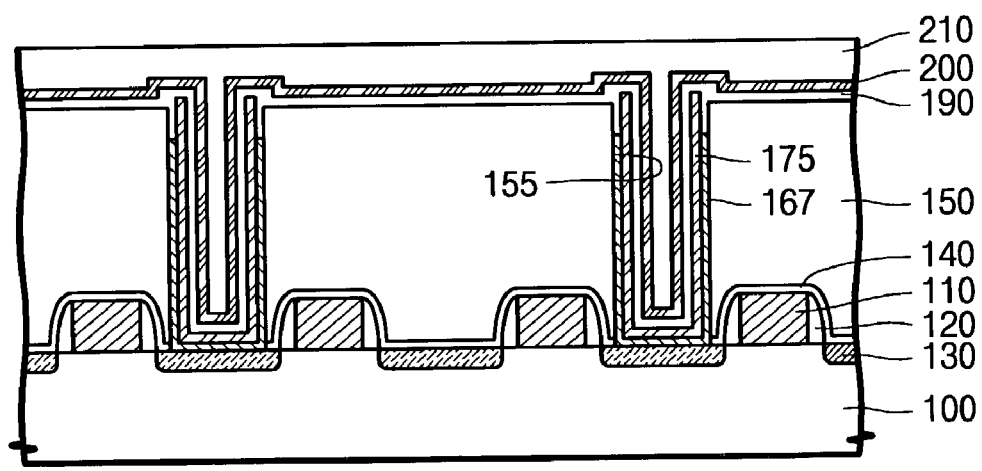

Referring to FIG. 7, a dielectric layer 190 and an upper electrode layer 200 are conformally deposited on an entire surface of the semiconductor substrate including the first lower electrode 167. A gap fill layer 210 is formed on an entire surface of the semiconductor substrate including the upper electrode layer 200 thereby completing the MIM capacitor structure.

As shown in FIG. 7, in some embodiments of MIM capacitors according to the present invention, the upper and lower electrodes of the MIM capacitor are in the recess 155 which is directly on the highly doped region 130. Because recess 155 is directly on the highly doped region 130, the height of the MIM capacitor relative to the transistor structure to which is connected can be reduced. The reduced height of the MIM capacitor can allow a reduction in a difference between the height of MIM capacitor according to the present invention and other capacitors in the EML semiconductor device.

Moreover, because the height of the MIM capacitor is reduced according to the present invention, the dielectric layer 190 can be a high dielectric constant. As is well known to those skilled in the art, a capacitance of a capacitor is proportional to a dielectric constant of a dielectric layer as well as a surface area of a capacitor electrode, and inversely proportional to a space between capacitor electrodes. Therefore, because the height of the DRAM cell MIM capacitor is reduced, a surface area of the MIM capacitor electrode is reduced which can reduce the capacitance of the MIM capacitor. Thus, in the event that the surface area of the capacitor electrode is reduced, a space between the capacitor electrodes could be reduced, or a capacitor dielectric layer could be composed of a material with a high dielectric constant in order to provide a sufficient capacitance (i.e., to compensate for a decrease in capacitance due to the reduction in the height of the MIM capacitor). However, it may be difficult to further reduce the spacing between the capacitor electrodes beyond current dimensions due to a resulting increase in a leakage current for the MIM capacitor. Therefore, embodiments of MIM capacitors according to the present invention can include a high k-dielectric layer so as to compensate for the reduced height of the capacitor to maintain adequate capacitance of the MIM capacitor.

In some embodiments according to the present invention, the dielectric layer 190 is preferably at least one selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). Alternatively, the dielectric layer 190 may be composed of one selected from the group consisting of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and $(Sr,Ca)RuO_3$.

In some embodiments according to the present invention, the upper electrode 200 is preferably composed of at least one selected from titanium nitride, titanium, cobalt, tungsten, and ruthenium. The gap fill layer 210 is formed to fill a remaining space of the recess 155 where the upper electrode 200 is formed. In some embodiments according to the present invention, the gap fill layer 210 is a tungsten layer or a silicon oxide layer. The gap fill layer 210 and the upper electrode layer 200 are successively patterned to form an upper electrode (not shown) and a gap fill pattern (not shown), which extend outside the recess 155 onto the adjacent surface.

Figure 8:
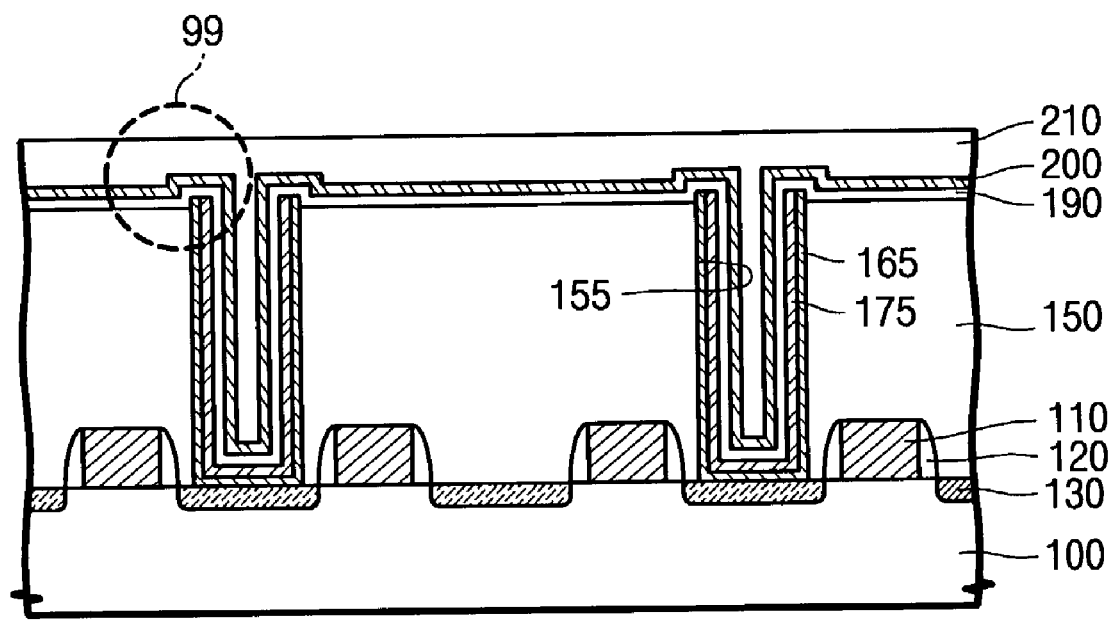
FIG. 8 is a cross-sectional view that illustrates methods of fabricating MIM capacitors in a semiconductor device according to embodiments of the present invention and MIM capacitors so formed.

FIG. 8 is a cross-sectional view that illustrates methods of fabricating MIM type capacitors of a semiconductor device according to embodiments of the present invention. The MIM capacitor shown in FIG. 8 can be partially fabricated using the steps illustrated in FIGS. 2 through 5. Accordingly, no further description of those steps will be provided here. According to FIG. 8, the etching of the first lower conductive layer pattern 165 into the recess 155, to form the gap shown in FIG. 6, is omitted. Thus, the first lower conductive layer pattern 165 has a higher top surface (or height) than that of the ILD pattern 150. The dielectric layer 190 and an upper electrode layer 200 are conformally deposited on an entire surface of the resultant structure where the sacrificial layer pattern 185 is removed. A gap fill layer 210 is formed on an entire surface of the semiconductor substrate including the upper electrode layer 200. The dielectric layer 190, the upper electrode layer 200, and the gap fill layer 210 are made of the same materials as those shown in FIG. 7, respectively.

Figure 9:
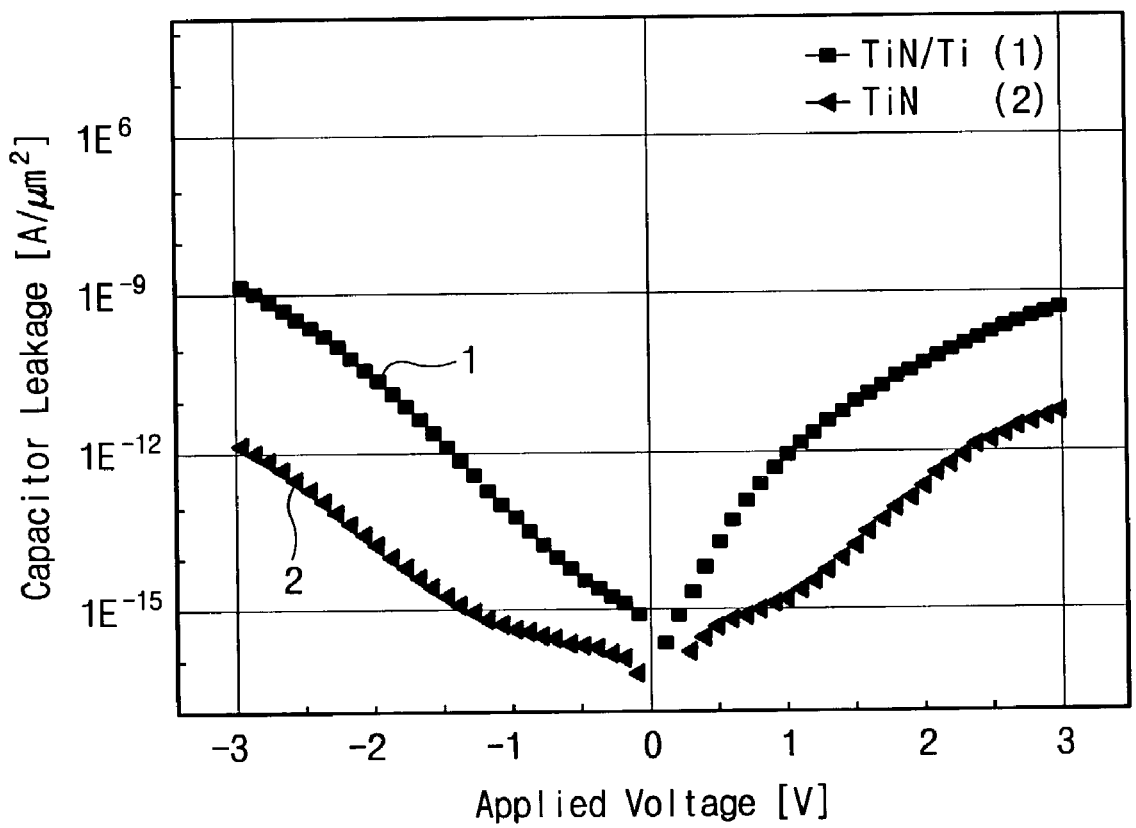
FIG. 9 is a graph showing leakage currents associated with a MIM capacitor according to embodiments of the present invention including TiN/Ti and TiN as the lower electrode materials of the MIM capacitor.

As described above, the first lower conductive layer pattern 165 can be formed of titanium to improve a contact resistance between the second lower conductive layer pattern 175 and the heavily doped region 130. However, in the event that the first lower conductive layer pattern 165, which is composed of titanium, has a higher top surface than that of the ILD pattern 150, a leakage current of the capacitor may be increased. FIG. 9 is a graph showing characteristics of the leakage current of the capacitor according to kinds of materials of the lower electrode of the capacitor. Reference numeral 1 represents results of an experiment on the capacitor, in which the titanium layer is exposed on the ILD pattern, as illustrated in FIG. 8. On the other hand, reference numeral 2 represents results of an experiment on the capacitor, in which the titanium layer has a lower top surface than the ILD pattern, as illustrated in FIG. 7. The horizontal and vertical axes of FIG. 9 correspond to an applied voltage and a leakage current, respectively.

Referring to FIG. 9, under a voltage of 1.0V, the leakage current 1 of the capacitor, in which the titanium layer is exposed on the ILD pattern, was measured to be about $10^{-12}$ A/$\mu m^2$. By comparison, under the same voltage of 1.0V, the leakage current 2 of the capacitor, in which the titanium layer has a lower top surface than that of the ILD, was measured to be $10^{-15}$ A/$\mu m^2$ or less. That is, the capacitor (2 of FIG. 7), in which the titanium layer is not exposed, enables the leakage current to be reduced more than 1000 times as much as the capacitor (1 of FIG. 8), in which the titanium layer is exposed.

Figure 10:
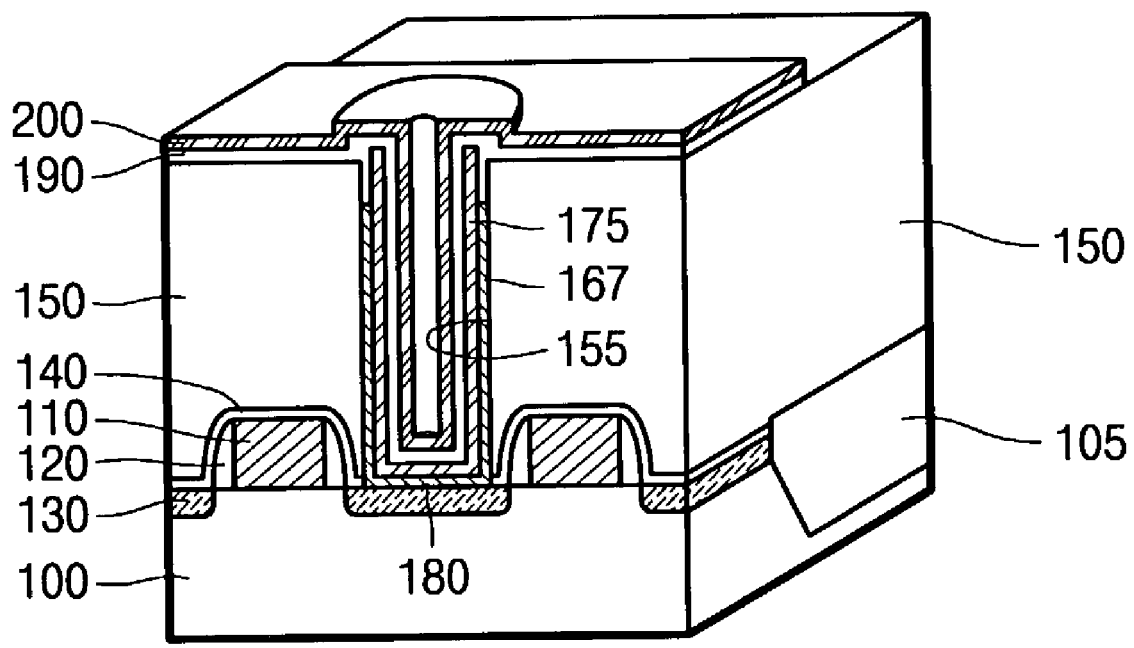
FIG. 10 is a perspective view that illustrates MIM capacitors according to embodiments of the present invention.

FIG. 10 is a perspective view that illustrates MIM capacitors of the semiconductor devices according to embodiments of the present invention. As shown in FIG. 10, a device isolation layer 105 is disposed at a predetermined region of a semiconductor substrate 100 to define an active region. A gate pattern 110 is disposed on the active region and on the device isolation layer 105. A spacer 120 is disposed on both side walls of the gate pattern 110. A heavily doped region (source/drain region) 130 is disposed in the active region between the spacers 120.

An ILD 150, which has an recess 155 exposing the heavily doped region 130, is disposed on an entire surface of the semiconductor substrate including the gate pattern 110 and the spacer 120. An etch stop layer pattern 140 is preferably disposed under the ILD pattern 150. The ILD pattern 150 is preferably a silicon oxide layer and the etch stop layer pattern 140 is preferably a material layer having an etch selectivity with respect to the ILD pattern 150.

A first lower electrode 167, a second conductive layer pattern 175, a dielectric layer 190, and an upper electrode 200 are sequentially stacked on an inner wall (or side wall) of the recess 155. The upper electrode 200 and the dielectric layer 190 are on the side wall in the recess and extended outside the recess 155 onto a surface of the ILD pattern 150.

The first lower electrode 167 is preferably made from a material selected from the group consisting of titanium, cobalt, titanium suicide, and cobalt silicide. The second lower conductive layer pattern 175 is preferably made of a material selected from the group consisting of titanium nitride, tungsten, and ruthenium.

The second lower conductive layer pattern 175 and the upper electrode 205 are preferably made of a material selected from the group consisting of titanium nitride, titanium, cobalt, tungsten, and ruthenium.

The dielectric layer 190 is preferably made from a material selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$). The dielectric layer 190 may be made of of $ZrO_2$, $Nb_2O_5$, $CeO_2$, $Y_2O_3$, $InO_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, and $(Sr,Ca)RuO_3$.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A capacitor of a semiconductor device, comprising:
   an interlayer dielectric layer pattern disposed on a semiconductor substrate, the interlayer dielectric layer having an opening exposing a top surface of the semiconductor substrate;
   a first lower electrode extending along a sidewall of the opening to a level below a top surface of the interlayer dielectric pattern and covering a top surface of the semiconductor substrate which is exposed through the opening;
   a second lower conductive layer pattern covering an inner wall of the first lower electrode, the second lower conductive layer pattern extending along the sidewall to a level higher than the level of the first lower electrode;
   a dielectric layer pattern covering the exposed surfaces of the first lower electrode and the second lower conductive layer pattern; and
   an upper electrode disposed on the dielectric layer pattern.

2. The capacitor of the semiconductor device as claimed in claim 1, further comprising a heavily doped region formed in the semiconductor substrate under the opening.

3. The capacitor of the semiconductor device as claimed in claim 1, wherein the first lower electrode is composed of at least one selected from the group consisting of titanium, cobalt, titanium suicide, and cobalt silicide.

4. The capacitor of the semiconductor device as claimed in claim 1, wherein the second lower conductive layer pattern is composed of at least one selected from the group consisting of titanium nitride, tungsten, and ruthenium.

5. The capacitor of the semiconductor device as claimed in claim 1, wherein the dielectric layer pattern is at least one selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

6. A method of forming a Metal-Insulator-Metal (MIM) capacitor comprising:
   forming an insulating layer pattern on a source/drain region of a transistor;
   forming a recess in the insulating layer pattern that exposes the source/drain region;
   forming a first electrode layer in the recess, including forming a first layer of the first electrode layer directly on the source/drain region and extending along sidewalls of the recess and forming a second layer of the first electrode layer on the first layer;
   forming a dielectric layer and a second electrode layer on the first electrode layer in the recess; and
   forming a MIM capacitor by removing a portion of the second electrode layer and the dielectric layer; and
   wherein forming a first electrode layer comprises:
   forming the first layer of the first electrode layer on the side wall of the recess and outside the recess on a surface of the insulating layer;
   forming the second layer of the first electrode layer extending along the side wall of the recess with the first layer of the first electrode layer therebetween;
   etching the first layer of the first electrode layer from the surface of the insulating layer and from the side wall into the recess beyond an opening of the recess to provide an exposed portion of the side wall; and
   avoiding etching the second layer of the first electrode layer from the side wall into the recess beyond the opening to form a gap between the side wall and the second layer of the first electrode layer.

7. A method according to claim 6 wherein the first layer of the first electrode layer comprises at least one of titanium and cobalt.

8. A method according to claim 6 wherein the second layer of the first electrode layer comprises titanium nitride.

9. A method of forming a Metal-Insulator-Metal (MIM) capacitor comprising:

forming an insulating layer pattern on a source/drain region of a transistor;

forming a recess in the insulating layer pattern that exposes the source/drain region;

forming a first electrode layer in the recess;

forming a dielectric layer and a second electrode layer on the first electrode layer in the recess; and forming a MIM capacitor by removing a portion of the second electrode layer and the dielectric layer using the second pattern; and wherein forming a first electrode layer comprises:
  forming a first layer of the first electrode layer on a side wall of the recess and outside the recess on a surface of the insulating layer; and
  forming a second layer of the first electrode layer on the first layer of the first electrode layer; and wherein the method further comprises:

etching the insulating layer to reduce a height thereof; and avoiding etching the second layer of the first electrode layer so that the second layer of the first electrode layer protrudes from the recess beyond the reduced height surface of the insulating layer.

10. A method of forming a Metal-Insulator-Metal (MIM) capacitor comprising:

forming an insulating layer pattern on a source/drain region of a transistor;

forming a recess in the insulating layer pattern that exposes the source/drain region;

forming a first electrode layer in the recess;

forming a dielectric layer and a second electrode layer on the first electrode layer in the recess; and forming a MIM capacitor by removing a portion of the second electrode layer and the dielectric layer using the second pattern; and wherein forming a first electrode layer comprises:
  forming a first layer of the first electrode layer on a side wall of the recess and outside the recess on a surface of the insulating layer; and
  forming a second layer of the first electrode layer on the first layer of the first electrode layer; and wherein the method further comprises:

avoiding etching the second layer of the first electrode layer from the side wall into the recess beyond the opening to form a gap between the side wall and the second layer of the first electrode layer, including etching the first electrode layer using an isotropic etch process with an etchant having an etch selectivity with respect to the second layer of the first electrode layer.

11. A method of forming a Metal-Insulator-Metal (MIM) capacitor comprising:

forming an insulating layer having a recess therein that exposes an underlying source/drain region of a transistor;

forming a first lower electrode layer of a MIM capacitor in the recess directly on the source/drain region and extending along a side wall of the recess;

forming a second lower electrode layer of the MIM capacitor in the recess on the first lower electrode layer; and forming a dielectric layer and an upper electrode layer of the MIM capacitor on the second lower electrode layer in the recess to provide the MIM capacitor; and wherein forming the first lower electrode layer comprises:
  forming the first lower electrode layer extending along the side wall of the recess and outside the recess on a surface of the insulating layer; and etching the first lower electrode layer from the surface of the insulating layer and from the side wall into the recess beyond an opening of the recess to provide an exposed portion of the side wall; and avoiding etching the second lower electrode layer from the side wall into the recess beyond the opening to form a gap between the side wall and the second lower electrode layer.

12. A method of fabricating a capacitor of a semiconductor device comprising:

forming an interlayer dielectric layer pattern on the semiconductor substrate, the interlayer dielectric layer having an opening exposing a semiconductor substrate;

sequentially stacking a first lower conductive layer, a second lower conductive layer, and a sacrificial layer on an entire surface of the semiconductor substrate including the interlayer dielectric layer pattern;

successively etching the sacrificial layer until a top surface of the interlayer dielectric layer pattern is exposed, to form a first lower conductive layer pattern, a second lower conductive layer pattern, and a sacrificial layer pattern, which sequentially fill an inner wall of the opening;

removing the sacrificial layer pattern;

etching the first lower conductive layer pattern using an etch recipe having an etch selectivity with respect to the second lower electrode pattern to form a first lower electrode having a lower top surface than that of the interlayer dielectric layer pattern; and sequentially forming a dielectric layer and an upper electrode layer on an entire surface of the semiconductor substrate including the first lower electrode.

13. The method as claimed in claim 12, further comprising:

forming a heavily doped region in the semiconductor substrate under the opening before forming the interlayer dielectric layer pattern.

14. The method as claimed in claim 12, wherein the first lower conductive layer comprises either titanium or cobalt.

15. The method as claimed in claim 12, wherein the second lower conductive layer is at least one selected from the group consisting of titanium nitride, tungsten, and ruthenium.

16. The method as claimed in claim 12, wherein the dielectric layer is at least one selected from the group consisting of a tantalum oxide layer ($Ta_2O_5$), an aluminum oxide layer ($Al_2O_3$), a titanium oxide layer ($TiO_2$), a silicon oxide layer ($SiO_2$), a silicon nitride layer ($Si_3N_4$), and a hafnium oxide layer ($HfO_2$).

17. The method as claimed in claim 12, wherein successively etching the sacrificial layer through the first lower conductive layer employs chemical mechanical polishing (CMP).

18. The method as claimed in claim 12, wherein removing the sacrificial layer pattern employs an etch recipe having an etch selectivity with respect to the interlayer dielectric layer pattern, the first lower conductive layer pattern, and the second lower conductive layer pattern.

19. The method as claimed in claim 12, wherein removing the sacrificial layer pattern uses an isotropic etch process.

20. The method as claimed in claim 12, wherein forming the first lower electrode is followed by removing the sacrificial layer pattern.

21. A method of fabricating a capacitor of a semiconductor device comprising:

forming an interlayer dielectric layer pattern on the semiconductor substrate, the interlayer dielectric layer having an opening exposing a semiconductor substrate;

sequentially stacking a first lower conductive layer, a second lower conductive layer, and a sacrificial layer on an entire surface of the semiconductor substrate including the interlayer dielectric layer pattern;

successively etching the sacrificial layer until a top surface of the interlayer dielectric layer pattern is exposed, to form a first lower conductive layer pattern, a second lower conductive layer pattern, and a sacrificial layer pattern, which sequentially fill an inner wall of the opening;

removing the sacrificial layer pattern;

etching the first lower conductive layer pattern to form a first lower electrode having a lower top surface than that of the interlayer dielectric layer pattern;

sequentially forming a dielectric layer and an upper electrode layer on an entire surface of the semiconductor substrate including the first lower electrode; and wherein forming the first lower electrode uses a mixed solution of $CH_3COOH$, $CH_3COONH_4$, $NH_4F$, and a deionized water.

22. A method of fabricating a capacitor of a semiconductor device comprising:

forming an interlayer dielectric layer pattern on the semiconductor substrate, the interlayer dielectric layer having an opening exposing a semiconductor substrate;

sequentially stacking a first lower conductive layer, a second lower conductive layer, and a sacrificial layer on an entire surface of the semiconductor substrate including the interlayer dielectric layer pattern;

successively etching the sacrificial layer until a top surface of the interlayer dielectric layer pattern is exposed, to form a first lower conductive layer pattern, a second lower conductive layer pattern, and a sacrificial layer pattern, which sequentially fill an inner wall of the opening;

removing the sacrificial layer pattern;

etching the first lower conductive layer pattern to form a first lower electrode having a lower top surface than that of the interlayer dielectric layer pattern;

sequentially forming a dielectric layer and an upper electrode layer on an entire surface of the semiconductor substrate including the first lower electrode; and wherein removing the sacrificial layer pattern is followed by forming the first lower electrode.

* * * * *

UNITED STATES PATENT AND TRADEMARK OFFICE
CERTIFICATE OF CORRECTION

PATENT NO. : 7,029,983 B2  Page 1 of 1
APPLICATION NO. : 10/318817
DATED : April 18, 2006
INVENTOR(S) : Hong-Kim Kim It is certified that error appears in the above-identified patent and that said Letters Patent is hereby corrected as shown below:

Column 10,
Line 19 should read -- cobalt, titanium silicide, and cobalt silicide. --

Signed and Sealed this

Nineteenth Day of September, 2006

JON W. DUDAS
*Director of the United States Patent and Trademark Office*